United States Patent [19]
Tomita

[11] Patent Number: 5,687,088
[45] Date of Patent: Nov. 11, 1997

[54] NET LIST FOR USE IN LOGIC SIMULATION AND BACK ANNOTATION METHOD OF FEEDBACKING DELAY INFORMATION OBTAINED THROUGH LAYOUT DESIGN TO LOGIC SIMULATION

[75] Inventor: Yasuhiro Tomita, Hyogo, Japan

[73] Assignee: Matsushita Electric Industrial Co., Ltd., Osaka, Japan

[21] Appl. No.: 242,421

[22] Filed: May 13, 1994

[30] Foreign Application Priority Data

May 19, 1993 [JP] Japan ................................. 5-116967
May 2, 1994 [JP] Japan ................................. 6-093382

[51] Int. Cl.$^6$ ........................................................ G06F 15/60
[52] U.S. Cl. .......................... 364/491; 364/489; 364/578; 395/500
[58] Field of Search .................................. 364/488, 489, 364/490, 491, 578; 395/500

[56] References Cited

U.S. PATENT DOCUMENTS

| | | | |
|---|---|---|---|
| 4,694,403 | 9/1987 | Nomura et al. | 364/488 |
| 4,827,428 | 5/1989 | Dunlop et al. | 364/491 |
| 5,168,455 | 12/1992 | Hooper | 364/490 |
| 5,197,015 | 3/1993 | Hartoog et al. | 364/490 |
| 5,202,841 | 4/1993 | Tani | 364/491 |
| 5,210,700 | 5/1993 | Tom | 364/489 |
| 5,235,521 | 8/1993 | Johnson et al. | 364/489 |
| 5,475,605 | 12/1995 | Lin | 364/488 |

FOREIGN PATENT DOCUMENTS 4-35042  2/1992  Japan .

OTHER PUBLICATIONS

Peter M. Van Peteghem, "On the Relationship between PSRR and Clock Feedthrough in SC Filters," IEEE, 1988, pp. 997–1004.

Genderen et al., "Reduced RC Models for IC Interconnections with Coupling Capacitances," IEEE, 1992, pp. 132–136.

Goel et al., "Modeling and Propagation Delays in the Croming interconnections ont he GaAs based VHSIC," IEEE, 1993, pp. 586–589.

Takayasu Sakurai, "Closed–Form Expression for Interconnection Delay, Coupling, and Crostalk in VLSI's", IEEE, 1993, pp. 118–124.

Chang et al., "HIVE: An Eficient Interconnect Capacitance Extractor to Support Submicron Multilevel Interconnect Designs," IEEE, 1991, pp. 294–297.

Grundmann et al., "XREF/Coupling: Capacitive Coupling error Checker," IEEE, 1990, p. 244–247.

*Primary Examiner*—Kevin J. Teska
*Assistant Examiner*—Thai Phan
*Attorney, Agent, or Firm*—McDermott, Will & Emery

[57] ABSTRACT

In a net list for use in logic simulation, a specific node connection having a coupled capacitance with a different node connection is provided with a delay adding means. The delay adding means has a table consisting of correction values for correcting a delay which correspond to delay variations caused by the coupled capacitance. To the delay adding means is transmitted the initial state, transition direction, and transition time of the logic output of a first logic cell for driving the above specific node connection. To the delay adding means is also transmitted, by means of a virtual connection for capacitive coupling, the initial state, transition direction, and transition time of the logic output of a second logic cell for driving the above different node connection. In this manner, the delay adding means selects a correction value from the above table and add the delay, in which the influence of the capacitive coupling is taken into account, to the logic output of the above first logic cell.

10 Claims, 8 Drawing Sheets

NET LIST FOR USE IN LOGIC SIMULATION AND BACK ANNOTATION METHOD OF FEEDBACKING DELAY INFORMATION OBTAINED THROUGH LAYOUT DESIGN TO LOGIC SIMULATION

BACKGROUND OF THE INVENTION

The present invention relates to a net list for implementing logic simulation in which a delay variation due to a capacitive coupling between installed wires are taken into consideration and to a method of back annotation for generating the net list.

In a typical process of designing a semiconductor integrated circuit, logical design and layout design are performed individually. At the final stage of the design process, delay information (e.g., wire length) obtained from the layout is feedbacked to logic simulation, thereby performing logic verification containing correct timing. Such a procedure is termed back annotation.

The logic design is achieved by generating a net list for use in logic simulation, in which the interconnection of logic cells is described. Each of the logic cells corresponds to an actual logic cell (e.g., an inverter, a logical NAND, or a logical NOR), and is composed of: a logical representation which is necessary to implement logic simulation; and information on a delay in propagating the logic of the logic cell which is obtainable from the layout. In the net list, a connection between the logic cells is termed a node connection, which indicates a wire installed between the logic cells in the layout by means of an automatic placement and routing tool or the like.

In logic simulation performed at an early stage of the logic design, correct timing information cannot be obtained because there is no definite information on the layout. The logic simulation performed at this stage is implemented using a virtual wiring delay which is obtained by assuming, by empirical techniques, a delay due to a wire installed between the logic cells.

In conventional timing verification after the definition of layout, logic simulation is implemented by: calculating a real wiring delay based on the wire length of a node connection obtainable from an automatic placement and routing tool or the like: and correcting timing information in the net list. Here, the real wiring delay is independently calculated in each node connection, based on such factors as wiring resistance and capacitance of the node connection of interest, driving capability of the logic cell which drives the node connection of interest, and input capacitance of a cell connected to the node connection of interest. As for the wiring capacitance, since wires constituting the node connections intersect or run close to each other at different points, there are coupled capacitances of different magnitudes between the wires. These coupled capacitances have been ignored by treating them as grounded capacitances or calculating them simply by multiplying wire lengths by a mean capacitance per unit wire length.

However, as semiconductor integrated circuits are increasingly miniaturized, wire width as well as wire spacing has become smaller, while the ratio of the coupled capacitance between wires to the total wiring capacitance has increased. As a result, the capacitive coupling between wires has increased to a point where its influence on the wiring delay cannot be ignored any more. If a large coupled capacitance exists between a first wire of interest and a second wire which is adjacent to the first wire, the amount of charges used to charge the coupled capacitance changes in response to the potential transition of the second wire. That is, the delay of the first wire changes in response to a change in logic state (potential transition) of the second wire. Since wires in the form of a bus line run close together for a relatively long distance, a particularly large coupled capacitance is generated therebetween, thereby greatly affecting the delay. With wires adjacent to each other, there is a case in which nodes irrelevant to each other in terms of design logic interfere with each other. If a timing failure due to the capacitive coupling is generated, it is difficult to analyze the cause of the failure in an actual device.

SUMMARY OF THE INVENTION

The present invention has been achieved in view of the foregoing. It is an object of the present invention to provide a net list and back annotation method whereby timing verification can be performed with high accuracy in logic simulation.

To attain the above object, further consideration was given to the influence of the capacitive coupling between wires connecting logic cells on the delay, and the following findings were produced consequently.

The logic of a signal is defined by the potential of a wire, and the propagation of the logic is carried out by charging or discharging to a threshold potential of a logic cell, relating to the capacitance of the wire. In other words, a delay in the propagation of the logic is determined by the time of the charging or discharging of the wire to a threshold potential of logic cell. In making transitions, two adjacent wires having a capacitive coupling therebetween use different amounts of charges to charge the coupled capacitance to a threshold potential of logic cell, depending on the initial states, transition direction, and transition time of their logics, so that they exert influences on each other's delay. Delay variations under these influences can be calculated in advance based on the initial states, transition directions, and transition times of the wires.

The present invention has been achieved on the basis of the above findings so as to provide logic simulation, wherein delay variations due to the capacitive coupling between wires connecting logic cells can easily be implemented, thereby enhancing the accuracy of timing verification.

Specifically, the net list for use in logic simulation of the present invention comprises: logic cells; node connections in designed logic; a delay adding means provided in a node connection which corresponds to a specific wire having a coupled capacitance between a different wire and itself, so as to selectively add, by means of a control input, a delay to the logic output of a first logic cell for driving said node connection; and a virtual connection for capacitive coupling for transmitting, to said delay adding means, the logic output of a second logic cell library for driving a node connection corresponding to said different wire as said control input.

With the above structure, since the delay adding means is provided in the node connection driven by the first logic cell, it can obtain the initial state, transition direction, and transition time of the logic output of the first logic cell. The delay adding means can also obtain the initial state, transition direction, transition time of the logic output of the second logic cell by means of the virtual connection for capacitive coupling. Consequently, it becomes possible for the delay adding means to obtain a delay variation resulting from a capacitive coupling between a specific wire and its adjacent wire, so that the delay time in which the influence of the capacitive coupling is taken into account can be added to the logic output of the first cell. By using a net list comprising the delay adding means and virtual connection for capacitive coupling, a delay variation due to the capacitive coupling between wires connecting logic cells can easily be implemented in logic simulation. Hence, it becomes possible to perform timing verification with high accuracy in logic simulation.

Preferably, said delay adding means has a table consisting of correction values for correcting a delay and determines a delay to be added to the logic output of said first logic cell library by selecting a correction value from said table based on the transition direction and transition time of the logic output of said second logic cell, which are determined by said control input. With the above structure, it becomes possible to preliminarily calculate correction values corresponding to delay variations, so that the delay adding means can easily be implemented by using the table of the correction values.

The back annotation method of feedbacking a wiring delay after layout to logic simulation of the present invention comprises the steps of: (a) extracting, for each node connection, a capacitance relating to said node connection from the layout; (b) calculating, for each node connection corresponding to a specific wire having a capacitive coupling between a different wire and itself, the strength of said capacitive coupling based on a coupled capacitance which is a capacitance resulting from said capacitive coupling; and (c) adding, for each node connection having the capacitive coupling the strength of which exceeds a specified threshold value, to a net list, a delay adding means for selectively adding a delay to the logic output of a logic cell provided in said node connection so as to drive said node connection by means of a control input and a virtual connection for capacitive coupling for transmitting, to said delay adding means, the logic output of a logic cell library for driving a node connection corresponding to said different wire as said control input.

With the above structure, it becomes possible to provide the delay adding means only in node connections in which the strengths of capacitive couplings exceed a specified threshold value, not in all the node connections having capacitive couplings. Consequently, the net list can be reduced to a valid size for efficient logic simulation.

Furthermore, the back annotation method of feedbacking a wiring delay after layout to logic simulation of the present invention comprises the steps of: (a) extracting, for each node connection, a capacitance relating to said node connection from the layout; (b) calculating, for each node connection corresponding to a specific wire having a capacitive coupling between a different wire and itself, a time constant (Rd×Cc) which is a product of the output impedance (Rd) of a logic cell for driving said specific wire and the coupled capacitance (Cc) which is a capacitance resulting from said capacitive coupling and a capacitance ratio (Cc/Ct) which is a ratio of the coupled capacitance (Cc) to a total capacitance (Ct) relating to said specific wire; and (c) adding, for each node connection in which the time constant (Rd×Cc) exceeds a specified first threshold value or the capacitance ratio (Cc/Ct) exceeds a specified second threshold value, to a net list, a delay adding means for selectively adding a delay to the logic output of a logic cell provided in said node connection so as to drive said node connection by means of a control input and a virtual connection for capacitive coupling for transmitting, to said delay adding means, the logic output of a logic cell for driving a node connection corresponding to said different wire as said control input.

With the above structure, there are calculated, for the purpose of indicating the strength of the capacitive coupling, the time constant which is the product of the output impedance of the logic cell and the capacitive coupling and the capacitance ratio which is the ratio of the capacitive coupling to the total wiring capacitance. The time constant represents an absolute magnitude of a delay variation resulting from the capacitive coupling, while the capacitance ratio represents a relative magnitude of the delay variation resulting from the capacitive coupling. Consequently, by setting a threshold value for the time constant whereby a delay with desired absolute accuracy can be obtained and by setting a threshold value for the capacitance ratio whereby a delay with desired relative accuracy can be obtained, a net list in which a delay with desired accuracy is taken into consideration can be generated.

Thus, according to the present invention, timing verification can be performed with high accuracy in logic simulation. As a result, it is no more necessary to allow for timing margins in the design process, which has conventionally been required, so that the number of gates, chip area, power consumption, and cost can be reduced. Since the influence of the inter-wire capacitive coupling on the delay increases with the increasing miniaturization of semiconductor integrated circuits, the efficacy of the present invention will be increased.

BRIEF DESCRIPTION OF THE DRAWINGS

FIG. 8(b) is a circuit diagram of an equivalent circuit when each of the nodes Na and Nb in the circuit of FIG. 3(a) makes a transition to H;

DETAILED DESCRIPTION OF THE PREFERRED EMBODIMENTS

Below, net lists according to the embodiments of the present invention will be described with reference to drawings.

Figure 1:
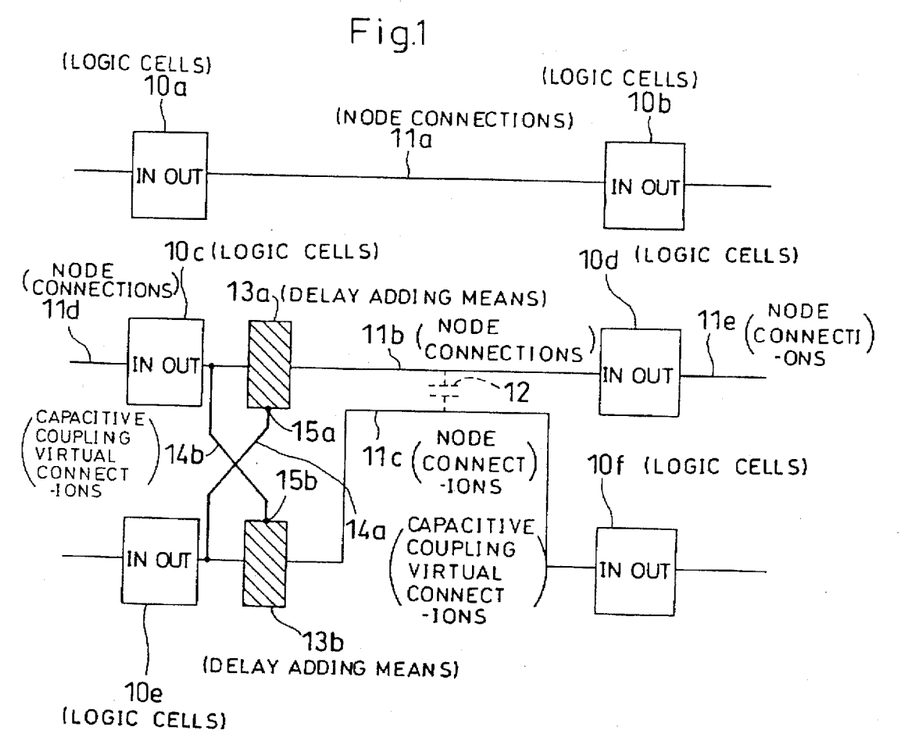
FIG. 1 is a conceptual view showing the structure of a net list according to a first embodiment of the present invention.

FIG. 1 is a view showing the structure of a net list according to a first embodiment of the present invention. In the drawing, the net list comprises six logic cells 10a to 10f. The left-hand terminals of the logic cells serve as input terminals and the right-hand terminals of the logic cells serve as output terminals. The interconnection of the logic cells determined at logic design stage is implemented by node connections 11a to 11e in designed logic. The node connections 11b and 11c are wires adjacent to each other, and a coupled capacitance 12 exists between the node connections 11b and 11c. Because of the coupled capacitance 12 between the node connections 11b and 11c, the node connections 11b and 11c are provided with delay adding means 13a and 13b, respectively. To transmit the initial state, transition direction, and transition time of the logic of the logic cell 10e to the delay adding means 13a, there is provided a virtual connection for capacitive coupling 14a, which is irrelevant to designed logic. Likewise, to transmit the initial state, transition direction, and transition time of the logic of the logic cell 10c to the delay adding means 13b, there is provided a virtual connection for capacitive coupling 14b, which is irrelevant to designed logic. The virtual connection for capacitive coupling is for connecting the node connection on one end of the coupled capacitance to a control input terminal of the delay adding means provided on the node connection on the other end thereof. For example, the logic output terminal of the logic cell 10e is connected to the control input terminal of the delay adding means 13a by means of the virtual connection for capacitive coupling 14a. Likewise, the logic output terminal of the logic cell 10c is connected to the control input terminal 15b of the delay adding means 13b by means of the virtual connection for capacitive coupling 14b.

Figure 2:
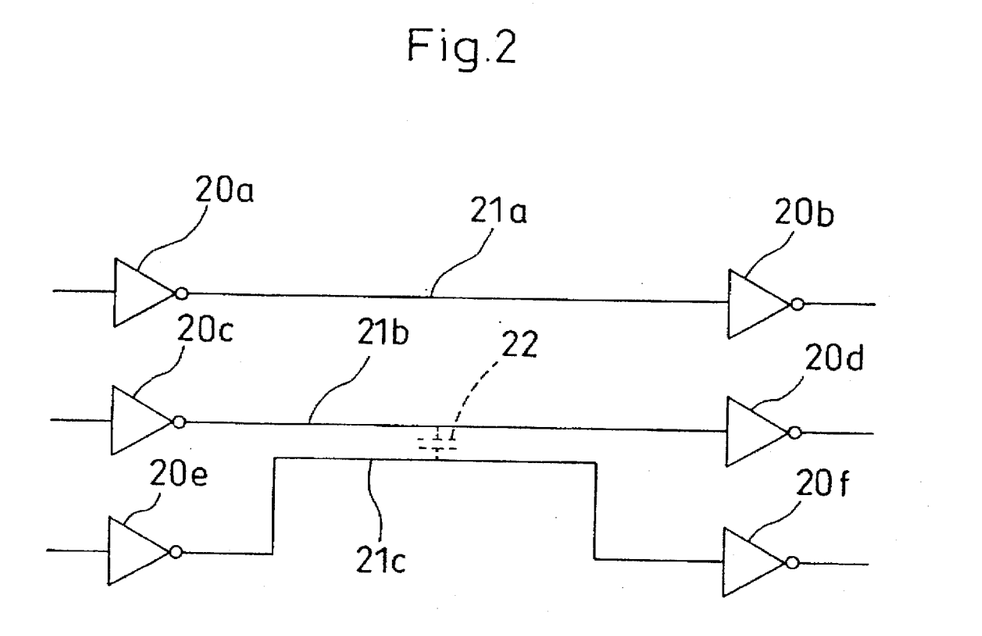
FIG. 2 is a circuit diagram of a circuit which corresponds to the net list of the first embodiment.

FIG. 2 is a view showing a circuit which corresponds to the net list of the first embodiment. In the drawing, reference numerals 20a to 20f designate inverters and 21a to 21c designate wires. The wires 21b and 21c are placed adjacent to each other, and a coupled capacitance 22 exists between the wires 21b and 21b. The wires 21b and 21c correspond to the node connections 11b and 11c shown in FIG. 1, respectively.

Referring now to FIGS. 3(a), 3(b), 3(c), 3(d), and 3(e), a description will be given to a process of correcting a delay variation resulting from the capacitive coupling, in which the initial state, transition direction, and transition time of the logic of the logic cell 10e are transmitted to the delay adding means 13a and the initial state, transition direction, and transition time of the logic of the logic cell 10c are transmitted to the delay adding means 13b.

Figure 3A:
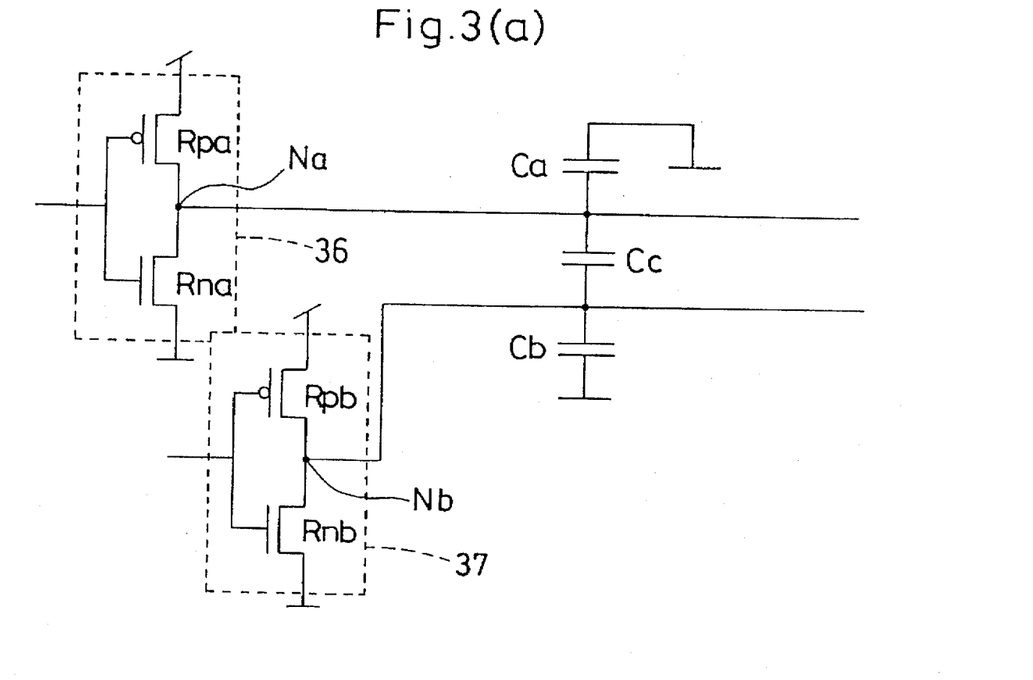
FIG. 3(a) is a circuit diagram of a circuit at a transistor level, which corresponds to the net list of the first embodiment.

FIG. 3(a) is an equivalent circuit which corresponds to a portion constituted by the inverters 20c and 20e and wires 21b and 21c in the circuit of FIG. 2. In the drawing, the output nodes of the inverters 36 and 37 are shown as nodes Na and Nb. Here, Cc designates a coupled capacitance and Ca and Cb designate capacitances without the coupled capacitance Cc in the nodes Na and Nb, respectively. On the other hand, Rpa and Rna designate an equivalent ON resistances of a transistor composing the inverter 36, while Rpb and Rnb designate the equivalent ON resistances of a transistor composing the inverter 37.

Figure 3B:
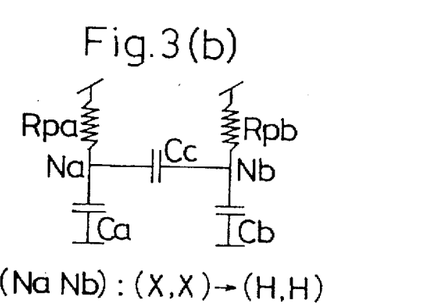
FIG. 3(c) is a circuit diagram of an equivalent circuit when each of the nodes Na and Nb in the circuit of FIG. 3(a) makes a transition to L.
FIG. 3(d) is a circuit diagram of an equivalent circuit when the nodes Na and Nb in the circuit of FIG. 3(a) make transitions to H and L, respectively.
FIG. 3(e) is a circuit diagram of an equivalent circuit when the nodes Na and Nb in the circuit of FIG. 3(a) make transitions to L and H, respectively.

Below, consideration will be given to a case where the nodes Na and Nb simultaneously make transitions from their given initial states to H and H. If it is supposed that an input lamp of the inverter operates far more quickly than a lamp for output waveform (the supposition holds true because a circuit in which capacitive coupling becomes a problem has a large load capacitance in most cases), the N-channel transistor composing the inverter will be rapidly transferred to the Off state, while the P-channel transistor will be substantially in the ON state during the state transition of the output node, so that the equivalent circuit approximates the circuit shown in FIG. 3(b). By setting the potentials prior to the state transition as the initial states of the nodes Na and Nb, time dependency of the potentials of the nodes Na and Nb can be dissolved and a delay can be calculated. The time dependency V(t) of the potentials of the nodes Na and Nb is represented by the following equation:

$$V(t) = K1 \times \exp(a \times t) + K2 \times \exp(b \times t) + K3$$

Figure 3D:
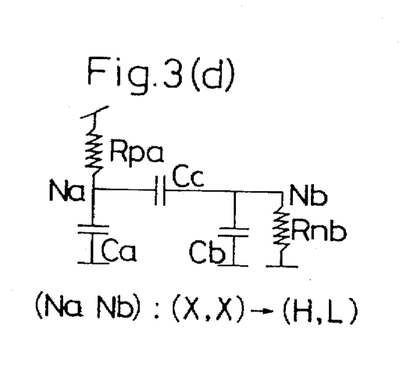
Figure 3E:
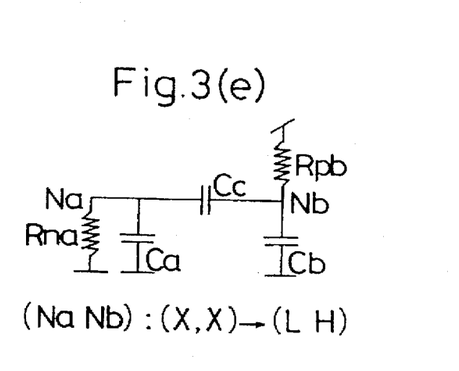
Figure 4A:
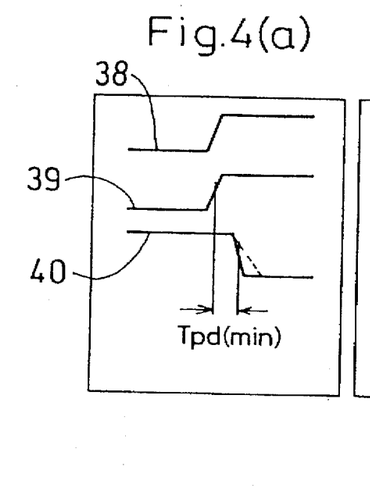
FIG. 4(a) is a timing chart showing a delay when the logics of the two inverters in the circuit of FIG. 3(a) make transitions in the same direction.
Figure 4B:
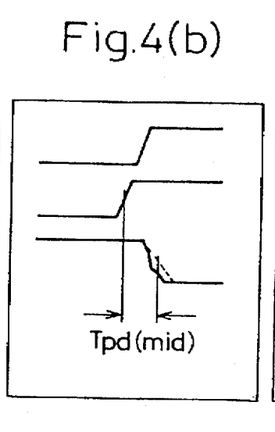
FIG. 4(b) is a timing chart showing a delay when there is a phase difference between the times at which the logics of the two inverters in the circuit of FIG. 3(a) make transitions.
Figure 4C:
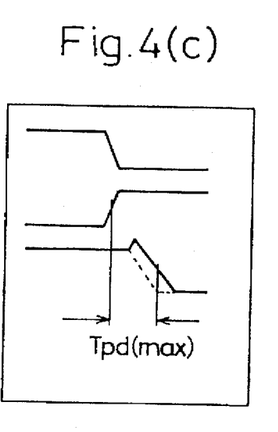
FIG. 4(c) is a timing chart showing a delay when the logics of the two inverters in the circuit of FIG. 3(a) make transitions in the opposite directions.
Figure 4D:
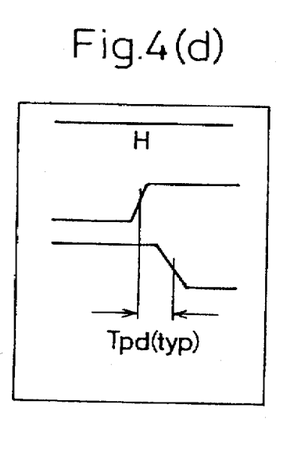
FIG. 4(d) is a timing chart showing a delay when the logic of either of the inverters in the circuit of FIG. 3(a) does not make a transition.

(wherein K1, K2, K3, a, and b are constants). Similarly, equivalent circuits in the case where the nodes Na and Nb simultaneously make transitions to L and L, H and L, and L and H are represented by FIGS. 3(c), 3(d), and 3(e), respectively. In the case where the nodes Na and Nb do not make transitions at the same time, the delay can be calculated by switching between the equivalent circuits of FIGS. 3(b), 3(c), 3(d), and 3(e) depending on the transition times of the nodes. In the equivalent circuits of FIGS. 3(b) to 3(e), wiring resistances are omitted. For more precision, the Cc, Ca, and Cb are divided into several RC segments in consideration of the wiring resistances. With a wire over several ten mm, in particular, a highly accurate calculation can be performed by treating the wire as a transmission line by considering self inductance and mutual inductance of the wire in addition to the wiring resistance and capacitance.

In summary, it will be appreciated that an equivalent circuit is determined by the direction of logic transition and that an initial value required to obtain the transient property of the equivalent circuit is determined by the initial state of logic prior to transition. Thus, by specifying the initial state, transition direction, and transition time of logic, the delay of a node connection having a capacitive coupling can be obtained. The value of an actual delay can easily be calculated through a transient analysis by a SPICE circuit simulator or the like.

FIGS. 4(a), 4(b), 4(c) and 4(d) are views showing delay variations which are generated from different logic-transition times of the inverters 36 and 37, in which a reference numeral 38 designates an input of the inverter 36, 39 designates an input of the inverter 37, and 40 designates an output of the inverter 37. The drawings indicate that a delay between the input and output of the inverter 37 varies depending on the input of the inverter 36. The delay reaches minimum when the logics of the inverters 38 and 37 make transitions in the same direction (Tpd(min) of FIG. 4(a)). Conversely, the delay reaches maximum when the logics of the inverters 38 and 37 make transitions in the opposite directions (Tpd(max) of FIG. 4(c)). The delay reaches an intermediate value between Tpd(max) and Tpd(min) when there is a phase difference between the logic-transition times of the inverters 38 and 37 or when the logic of the inverter 38 does not make a transition (Tpd(med) of FIG. 4(b) or Tpd(typ) of FIG. 4(d), respectively.

The delay adding means 13a and 13b of FIG. 1 have a table of correction values for correcting a delay which have been previously calculated using the logic-transition directions and logic-transition time difference as indices. In the delay adding means 13a, a correction value is determined based on the initial state, transition direction, and transition time of the logic of a logic cell 10e, which are transmitted by the virtual connection for capacitive coupling 14a, and on the output of the logic cell 10c. In the delay adding means 13b, a correction value is determined based on the initial state, transition direction, and transition time of the logic of the logic cell 10c, which are transmitted by the virtual connection for capacitive coupling 14b, and on the output of the logic cell 10e. These correction values can be calculated by means of the SPICE circuit simulator or the like prior to the execution of logic simulation.

The following Table 1 shows an example of the table of correction values for correcting a delay.

TABLE 1

| NODE NAME | TRANSITION DIRECTION | TRANSITION TIME DIFFERENCE | CORRECTION VALUE |
|---|---|---|---|
| Na | H → L | +1.0 ns | −0.01 ns |
| Nb | H → L | | −0.05 ns |
| Na | H → L | +0.5 ns | −0.10 ns |
| Nb | H → L | | −0.50 ns |
| Na | H → L | 0.0 ns | −1.00 ns |
| Nb | H → L | | −2.00 ns |
| Na | H → L | −0.5 ns | −0.00 ns |
| Nb | H → L | | −1.50 ns |
| . | . | . | . |
| . | . | . | . |
| . | . | . | . |

In Table 1, for example, a logic transition from H to L is represented by "H→L." A transition time difference when the transition time of the node Na is Tna and the transition time of the node Nb is Tnb is represented by (Tna-Tnb). In Table 1, a correction value is determined using the node name, transition direction, and transition time difference as indices. The correction value for a transition time difference which falls between the discrete time differences shown in Table 1 can be calculated by interpolation.

Although the delay adding means 13a and 13b have the table of correction values for correcting a delay in the present embodiment, it is also possible to provide, in place of the table, a calculation means for calculating correction values in real time during logic simulation.

Figure 5:
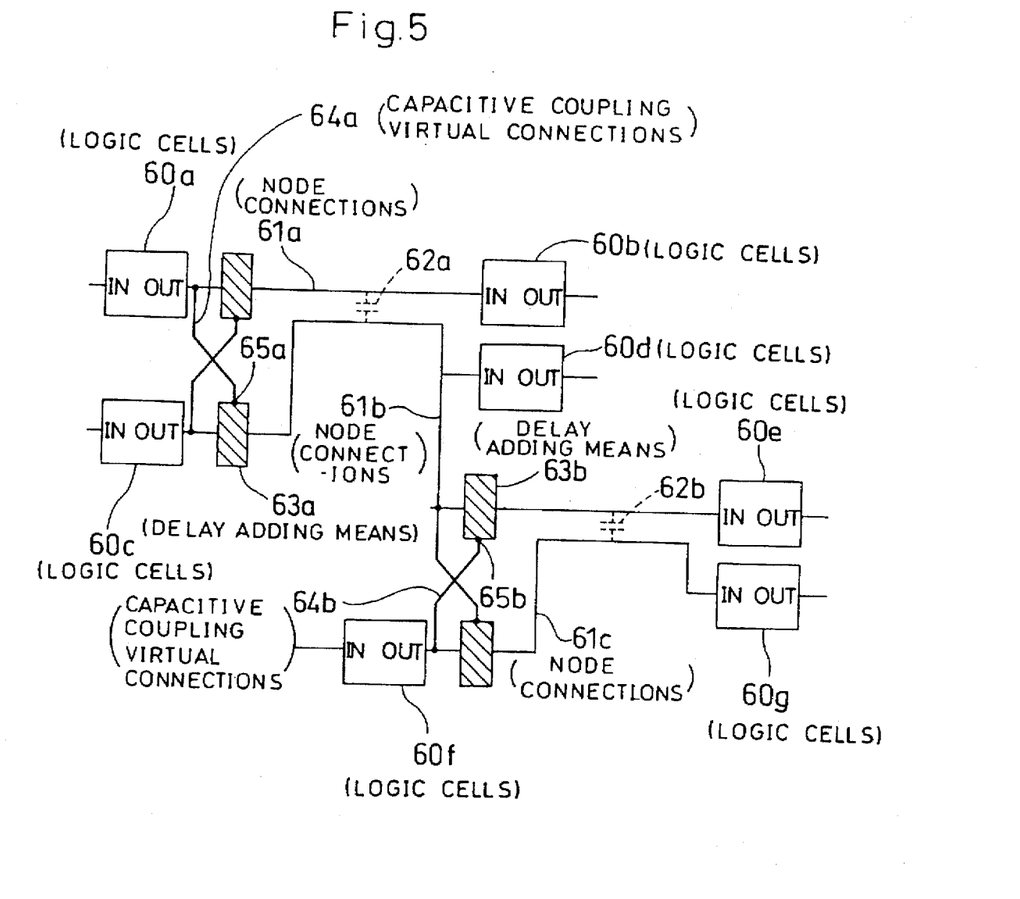
FIG. 5 is a conceptual view showing the structure of a net list according to a second embodiment of the present invention.

FIG. 5 is a view showing the structure of a net list according to a second embodiment of the present invention. In the drawing, the net list comprises seven logic cells 60a to 60g. A node connection 61b has capacitive couplings between a node connection 61a and itself and between a node connection 61b and itself. To represent the two capacitive couplings, the node connection 61b is provided with two delay adding means 63a and 63b. To a control input terminal 65a of the delay adding means 63a is connected a virtual connection for capacitive coupling 64a for transmitting the initial state, transition direction, and transition time of the logic of the logic cell 60a. To a control input terminal 65b of the delay adding means 63b is connected a virtual connection for capacitive coupling 64b for transmitting the initial state, transition direction, and transition time of the logic of the logic cell 60f.

Figure 6:
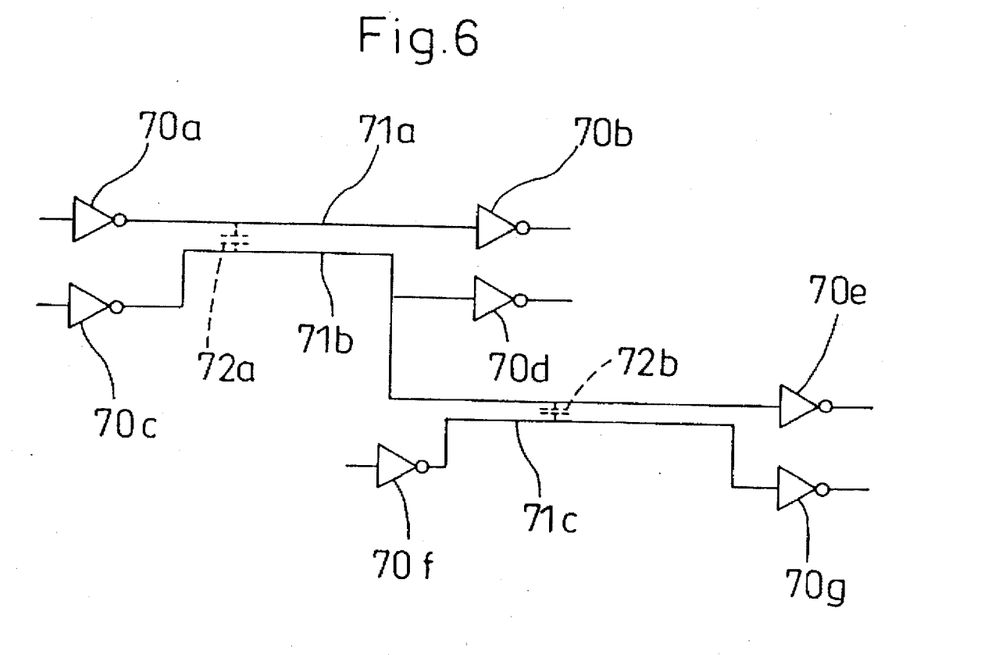
FIG. 6 is a circuit diagram of a circuit which corresponds to the net list of the second embodiment.

FIG. 6 is a view showing a circuit corresponding to the net list of the second embodiment shown in FIG. 5. In the drawing, reference numerals 70a to 70g designate inverters and 71a to 71c designate wires. Each of the wires 71a and 71c is placed adjacent to the wire 71b, so that a coupled capacitance 72a exists between the wires 71a and 71b and a coupled capacitance 72b exists between the wires 71b and 71c. The wires 71a, 71b, and 71c correspond to the node connections 61a, 81b, and 61c shown in FIG. 5, respectively.

Figure 7:
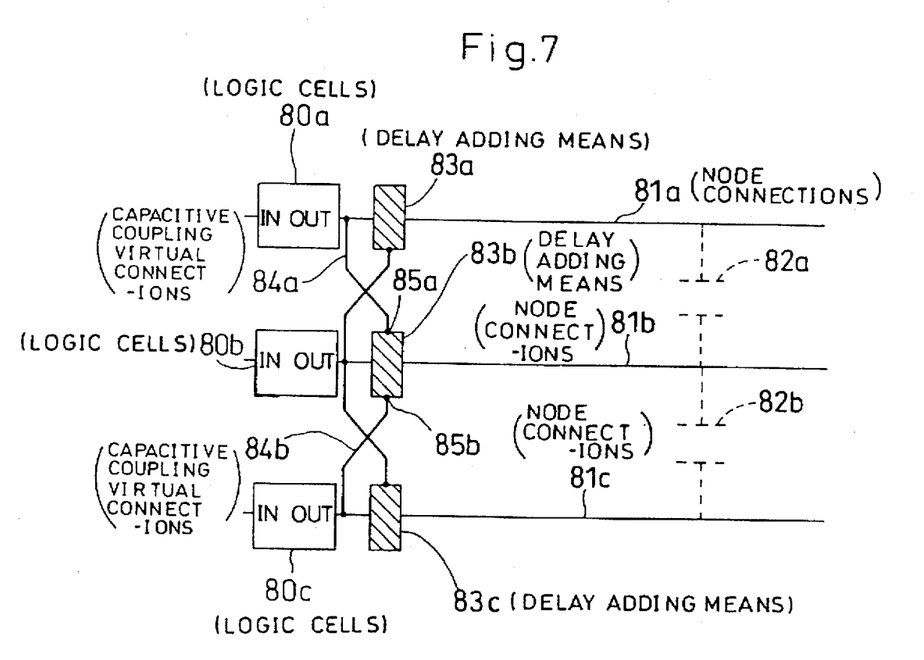
FIG. 7 is a conceptual view showing the structure of a net list according to a third embodiment of the present invention.

FIG. 7 is a view showing the structure of a net list according to a third embodiment of the present invention. In the drawing, the net list comprises three logic cells 80a to 80c. A node connection 81b which corresponds to the middle one of three parallel wires is provided with a delay adding means 83b. Node connections 81a and 81c which correspond to the side ones of the three parallel wires are provided with delay adding means 83a and 83c, respectively. The delay adding means 83b has two control input terminals 85a and 85b so that the initial state, transition direction, and transition time of the logic of the logic cell 80a are obtained by means of a virtual connection for capacitive coupling 84a which is connected to the control input terminal 85a and that the initial state, transition direction, and transition time of the logic of the logic cell 80c are obtained by means of a virtual connection for capacitive coupling 84b which is connected to the control input terminal 85b.

As shown in the net lists of the second and third embodiments, a capacitive coupling having a given geometry can easily be represented by providing a single node connection with a plurality of delay adding means or by providing a delay adding means having a plurality of control input terminals.

Thus, according to the first, second, and third embodiments, timing simulation in which capacitive coupling is taken into consideration can easily be implemented by providing the delay adding means and virtual connection for capacitive couplings in the net lists used in logic simulation.

Next, an example of a back annotation method for generating the net lists of the first, second, and third embodiments will be described with reference to drawings.

Figure 8:
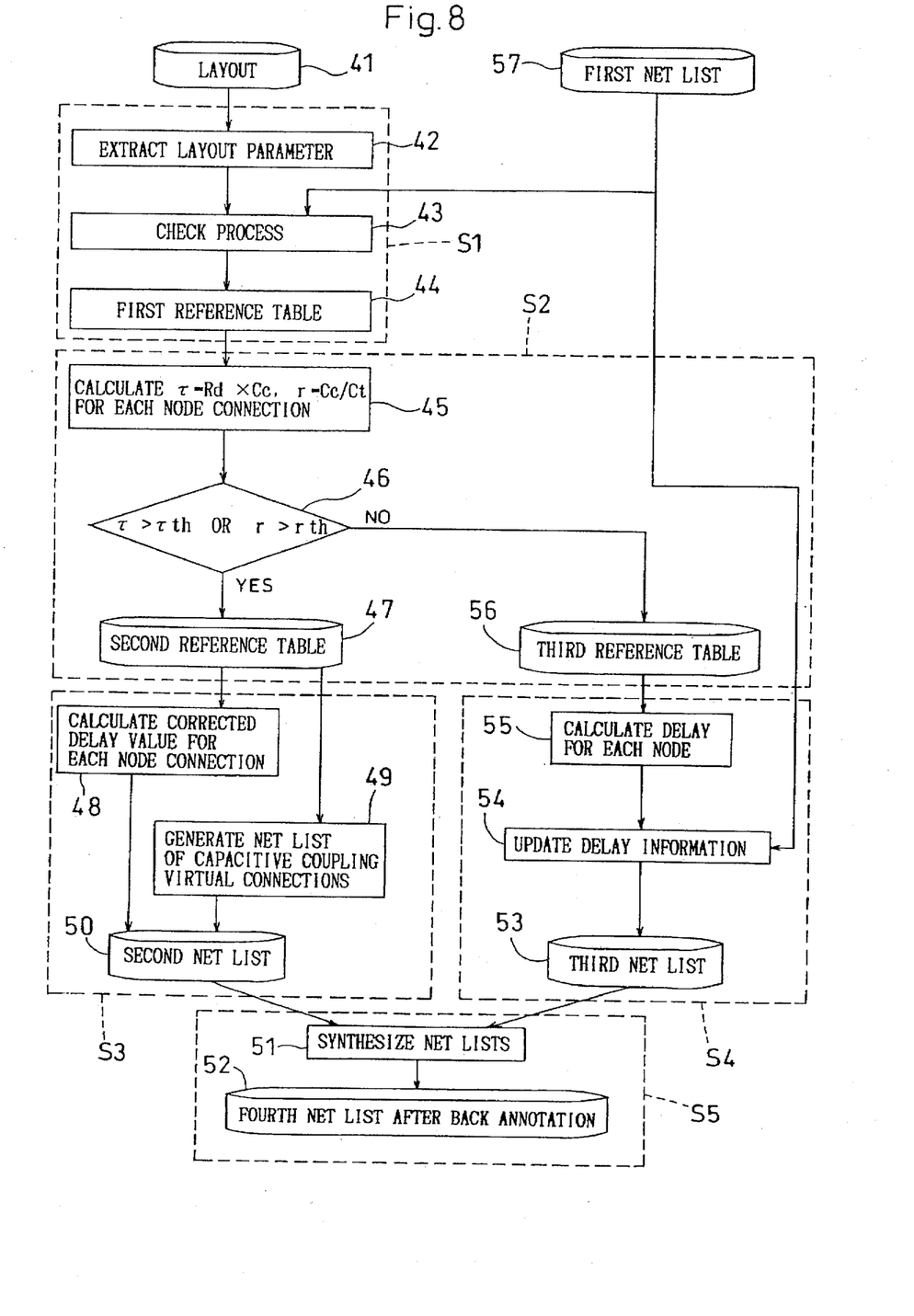
FIG. 8 is a flow chart showing a method of back annotation according to the first, second, and third embodiments.

FIG. 8 is a flow chart showing the back annotation method according to the present embodiment. In the drawing, a reference numeral 57 designates a first net list prior to back annotation and 41 designates layout in which logic cells have been placed and wires have been installed based on the first net list 57.

In Step S1, data on the wiring resistance, capacitance, and the like accompanying the installation of a node connection is extracted from the layout 41 by a layout parameter extract (LPE) process 42. The extracted data is checked against the corresponding node connection name in the first net list 57 by a check process 48 and then converted to a first reference table 44 which shows the relationships among the node connection name, logic cell driving capability Rd, total wiring capacitance Ct, and coupled capacitance Cc. An example of the first reference table 44 is shown in Table 2.

TABLE 2

| NODE CONNECTION NAME 1 | DRIVING CAPABILITY OF LOGIC CELL (Rd) COUPLED CAPACITANCE 1 (Cc) COUPLED CAPACITANCE 2 (Cc) . . . | TOTAL WIRING CAPACITANCE (Ct) MATING NODE NAME 1 IN TERMS OF CAPACITIVE COUPLING MATING NODE NAME 2 IN TERMS OF CAPACITIVE COUPLING . . . |
|---|---|---|
| NODE CONNECTION NAME 2 | DRIVING CAPABILITY OF LOGIC CELL (Rd) COUPLED CAPACITANCE 1 (Cc) COUPLED CAPACITANCE 2 (Cc) . . . | TOTAL WIRING CAPACITANCE (Ct) MATING NODE NAME 1 IN TERMS OF CAPACITIVE COUPLING MATING NODE NAME 2 IN TERMS OF CAPACITIVE COUPLING . . . |

In Table 2, a plurality of node connections are shown. There are also shown, for each node connection, the driving capability Rd (equivalent to output impedance) of a logic cell which drives the node connection, the total wiring capacitance Ct of the node connection, a plurality of coupled capacitances Cc, and the names of mating nodes in terms of the coupled capacitances. Thus, the first reference table 44 contains information necessary to constitute inter-wire capacitive couplings in the net list.

Next, in Step S2, a time constant $\tau = Rd \times Cc$ and a capacitance ratio $r = Cc/Ct$ are calculated for each node connection using the first reference table 44 by a calculation process 45. The time constant $\tau$ indicates an absolute magnitude of a delay variation resulting from a capacitive coupling, while the capacitance ratio r indicates a relative magnitude of the delay variation in the node connection resulting from the capacitive coupling. In each parameter, a larger value indicates a larger influence of the capacitive coupling.

In general, it is difficult to treat all the coupled capacitances because of such constraints as net list size and simulation time. Hence, it is necessary to selectively treat influential coupled capacitances. As the selecting conditions, the threshold value $\tau$th and the threshold value rth are used. In a judgment process 46, the node connections in the first reference table 44 are divided into node connections in a second reference table 47 in which $\tau > \tau$th or $r > r$th (i.e., the delay variation due to a coupled capacitance is $\tau$th [ns] or more or the ratio of the delay variation resulting from the coupled capacitance to the total delay is rth or more) and node connections in a third reference table 56 which are other than the node connections in the second reference table 47.

In Step S3, there are performed a table calculation process 48 for calculating, for each node connection, a correction value in the table of the delay adding means based on the second reference table 47 and a net list generation process 49 of generating a net list composed of the delay adding means and virtual connection for capacitive coupling. Based on the results of the table calculation process 48 and net list generation process 49, there is generated a second net list 50 which contains information on a delay accompanying a capacitive coupling.

Each process performed in Step S4 is similar to a conventional back annotation method. There are performed: a delay calculation process 55 for calculating, for each node connection, a wiring delay based on the third reference table 56; and a delay update process 54 for updating information on the delay in the first net list 57 based on the calculation result, thereby obtaining a third net list 53 in which back annotation has been performed with respect to node connections having no capacitive coupling.

In Step S5, there is performed a net list synthesis process 51 for synthesizing the third net list 53 and second net list 50, so as to obtain a fourth net list 52 in which back annotation has been performed with respect to coupled capacitances.

Thus, according to the back annotation method of the present embodiment, it becomes possible to implement inter-wire capacitive couplings in the net list. Moreover, minimum effects of the capacitive couplings are selectively added to the net list in which back annotation has been performed, depending on the strengths of the capacitive couplings.

Although the present embodiment has used the time constant r and capacitance ratio $\tau$ in order to determine node connections in which the effects of the coupled capacitances are taken into consideration, it is also possible to use a value obtained by a different method of calculating the strengths in order to select node connections. For example, it is possible to use $\tau = (Rd + Rw) \times Cc$ without omitting the wiring resistance Rw of a node connection. In the case of using a material having an extremely small resistance for wires, a self inductance may be treated instead of the wiring resistance. Mutual inductances, which interact between wires, may serve as a factor in changing the delay. However, since a large mutual inductance is accompanied by a large coupled capacitance, it is possible in the present embodiment to extract a node connection accompanied by the large mutual inductance.

A major point of the back annotation method according to the present embodiment is to evaluate the strength of a capacitive coupling and selectively provide a node connection having a strong capacitive coupling with the delay adding means.

We claim:

1. A back annotation method of feedbacking a wiring delay after layout to logic simulation, comprising the steps of:

extracting, for each node connection, a capacitance relating to said node connection from the layout;

calculating, for each node connection corresponding to a specific wire having a capacitive couplinE between a different wire and itself, the strength of said capacitive coupling based on a coupled capacitance which is a capacitance resulting from said capacitive coupling; and adding, for each node connection having the capacitive coupling the strength of which exceeds a specified threshold value, to a net list, a delay adding means for selectively adding a delay to the logic output of a logic cell provided in said node connection so as to drive said node connection by means of a control input and a virtual connection for capacitive coupling for transmitting, to said delay adding means, the logic output of a logic cell for driving a node connection corresponding to said different wire as said control input.

2. A back annotation method of feedbacking a wiring delay after layout to logic simulation, comprising the steps of:

extracting, for each node connection, a capacitance relating to said node connection from the layout;

calculating, for each node connection corresponding to a specific wire having a capacitive coupling between a different wire and itself, a time constant (Rd×Cc) which is a product of the impedance (Rd) of a logic cell for driving said specific wire and the coupled capacitance (Cc) which is a capacitance resulting from said capacitive coupling and a capacitance ratio (Cc/Ct) which is a ratio of the coupled capacitance (Cc) to a total capacitance (Ct) relating to said specific wire; and adding, for each node connection in which the time constant (Rd×Cc) exceeds a specified first threshold value or the capacitance ratio (Cc/Ct) exceeds a specified second threshold value, to a net list, a delay adding means for selectively adding a delay to the logic output of a logic cell provided in said node connection so as to drive said node connection by means of a control input and a virtual connection for capacitive coupling for transmitting, to said delay adding means, the logic output of a logic cell for driving a node connection corresponding to said different wire as said control input.

3. A netlist for use in logic simulation comprising:

logic cells;

node connections for connecting between the respective logic cells:

delay adding means, provided at one of said node connections which corresponds to one wire having a coupled capacitance between a different wire and itself, said delay adding means being provided for adding a delay time to a logic output of a first logic cell driving said one node connection; and a virtual connection for capacitive coupling for transmitting to said delay adding means a logic output of a second logic cell driving a node connection corresponding to said different wire, wherein the delay adding means is capable of changing the delay time to be added to a logical output of a first logic cell in accordance with the logical output of the second logic cell transmitted by the virtual connection for capacitive coupling.

4. The netlist according to claim 3, wherein said delay adding means determines a delay time to be added to the logic output of said first logic cell based on the logic output of said first logic cell and the logic output of said second logic cell that is transmitted by said virtual connection for capacitive coupling.

5. The netlist according to claim 4, wherein said delay adding means determines a delay time to be added to the logic output of said first logic cell based on a transition direction and a transition time difference of the logic outputs of said first logic cell and said second logic cell.

6. The netlist according to claim 5, wherein said delay adding means comprises a table composed of correction values of a delay time and determines a delay time to be added to the logic output of said first logic cell by selecting a correction value of a delay time from the table.

7. A back annotation method of feedbacking a wiring delay time information after layout to logic simulation, comprising the steps of:

providing, in a netlist used for the logic simulation, delay adding means for adding delay time to a logic output of a first logic cell driving a node connection corresponding to one wire having a coupled capacitance between a different wire and itself;

providing, in said netlist, a virtual connection for capacitive coupling that transmits to the delay adding means a logic output of a second logic cell driving a node connection corresponding to the different wire; and using the delay adding means for changing the delay time to be added to a logical output of a first logic cell in accordance with the logical output of the second logic cell transmitted by the virtual connection for capacitive coupling.

8. The back annotation method according to claim 7, wherein said delay adding means determines a delay time to be added to the logic output of said first logic cell based on the logic output of said first logic cell and the logic output of said second logic cell that is transmitted by the virtual connection for capacitive coupling.

9. The back annotation method according to claim 7, wherein said delay adding means determines a delay time to be added to the logic output of said first logic cell based on a transition direction and a transition time difference of the logic outputs of said first logic cell and said second logic cell.

10. The back annotation method according to claim 7, wherein said delay adding means comprises a table composed of correction values of a delay time and determines a delay time to be added to the logic output of said first logic cell by selecting a correction value of a delay time from the table.

* * * * *

UNITED STATES PATENT AND TRADEMARK OFFICE
CERTIFICATE OF CORRECTION

PATENT NO.    : 5,687,088
DATED         : November 11, 1997
INVENTOR(S)   : Yasuhiro TOMITA It is certified that error appears in the above-indentified patent and that said Letters Patent is hereby corrected as shown below:

Col. 10, line 63, delete "couplinE" and insert --coupling--.

Signed and Sealed this

Twenty-eighth Day of April, 1998

Attest:

BRUCE LEHMAN

Attesting Officer

Commissioner of Patents and Trademarks